(12) United States Patent
Vaassen

(10) Patent No.: US 12,038,812 B2
(45) Date of Patent: Jul. 16, 2024

(54) MEMORY SAFETY INTERFACE CONFIGURATION

(71) Applicant: Synopsys, Inc., Mountain View, CA (US)

(72) Inventor: Adrianus Wilhelmus Petrus Gerardus Gertruda Vaassen, Waalre (NL)

(73) Assignee: Synopsys, Inc., Sunnyvale, CA (US)

( * ) Notice: Subject to any disclaimer, the term of this patent is extended or adjusted under 35 U.S.C. 154(b) by 101 days.

(21) Appl. No.: 17/839,379

(22) Filed: Jun. 13, 2022

(65) Prior Publication Data

US 2022/0398158 A1 Dec. 15, 2022

Related U.S. Application Data

(60) Provisional application No. 63/210,439, filed on Jun. 14, 2021.

(51) Int. Cl.
*G06F 11/00* (2006.01)
*G06F 11/14* (2006.01)
*G06F 12/02* (2006.01)

(52) U.S. Cl.
CPC .......... *G06F 11/141* (2013.01); *G06F 12/02* (2013.01); *G06F 2201/805* (2013.01); *G06F 2212/251* (2013.01)

(58) Field of Classification Search
CPC ........ G06F 11/141; G11C 29/00; G11C 29/04
See application file for complete search history.

(56) References Cited

U.S. PATENT DOCUMENTS

| | | | | |
|---|---|---|---|---|
| 2014/0372814 | A1* | 12/2014 | Oberlaender | G11C 29/42 714/719 |
| 2022/0398158 | A1* | 12/2022 | Vaassen | G06F 11/141 |

\* cited by examiner

*Primary Examiner* — Philip Guyton
(74) *Attorney, Agent, or Firm* — Fenwick & West LLP

(57) ABSTRACT

A memory safety interface module (MSIM) configured to test a memory. The MSIM receives an original data from a digital logic and inverts the bits of the original data to generate an inverted data. It writes the inverted data to the memory address. The MSIM reads the inverted data from the memory address and determines whether the memory address and the inverted data are correct. The MSIM either writes the original data to the memory address in response to the memory address and the inverted data being correct or transmits an error indication in response to at least one of the memory address and the inverted data being incorrect. The MSIM reads the original data from the memory address and determines whether the memory address and the original data are correct or transmits an error indication in response to at least one of the memory address and the original data being incorrect.

20 Claims, 15 Drawing Sheets

FIG. 6

MEMORY SAFETY INTERFACE CONFIGURATION

CROSS REFERENCE TO RELATED APPLICATIONS

This application claims the benefit of U.S. Provisional Application No. 63/210,439, filed Jun. 14, 2021, which is incorporated by reference in its entirety.

TECHNICAL FIELD

The present disclosure generally relates to an interface circuit. In particular, the present disclosure relates a system and method for providing a memory interface between a digital logic and a memory.

BACKGROUND

In an integrated circuit (IC) design that includes digital logic and a memory, safety configurations need to verify that over the lifetime of a product that the memory stores correct data. If a memory does not have correct data, an alarm may trigger that notifies that the data is faulty and an action needs to be taken; e.g., reset it, or start detailed analysis.

With respect to memory testing, a solution includes adding a memory built-in self-test (MBIST) around the memory. The MBIST verifies the memory itself but not the connectivity towards the memory. The MBIST also does not test that the signal paths from the memory towards the digital logic is correct. Moreover, the MBIST only verifies stuck-at faults. Further, the MBIST can take a significant number of clock cycles to verify an entire memory. Accordingly, MBIST significantly increases application boot time at start/power-up, e.g., after power on reset, the memories and logic first will be tested causing the application to wait until the MBIST is completed to start the boot procedure.

In addition to MBIST, digital logic may be tested with a software test library (STL). Running an STL test stops a mission mode of a chip. With the mission mode stopped, context is switched to run the STL library. It is noted that context may correspond to the task that was running in mission mode is put on hold, and the processor is going to execute another task and when done return to the mission mode original task. Once the STL test is done, context is switched back to mission mode. Context switching with STL testing is required approximately every 100 milliseconds (ms) to meet the safety requirement that certain faults can be detected within the required timeframe. This testing consumes bandwidth, increases code size, and increases chip area to accommodate the testing mechanisms.

Another problem with STL testing relates to memory access. When the digital logic does not have software access to the memory, there is no path to the memory to test the memory interconnect. Yet another problem with STL testing relates to security. For example, sensitive data may be stored in the memory such as encryption keys.

SUMMARY

Disclosed is a system and method to test a memory address of a memory and a data within the memory address. In one example embodiment, the system receives an original data from a digital logic and inverts the bits of the original data to generate an inverted data. The system writes the inverted data to the memory address and reads the inverted data from the memory address. The system determines whether the memory address and the inverted data are correct. If the memory address and the inverted data are correct, the system writes the original data to the memory address. If the memory address and the inverted data are incorrect, the system transmits an error indication to a digital logic.

In an alternate embodiment, a system and a method to test memory may be configured to transmit a first write signal, a memory address, and an original data to a memory to initiate a write a first memory enable signal. The system stores the memory address in an address write buffer and the data in a data write buffer. The system then inverts each bit of the original data to form an inverted data and stores in a delay buffer the inverted data and the memory address. The system concatenates the inverted data and the memory address in an error detection generator to generate a first error identifier (e.g., error correction code (ECC) or error detection code (EDC)). The system can then transmit to the memory the inverted data and the first error identifier. The system then transmits to the memory a second memory enable signal and a first read signal. The system reads from the memory address the inverted data and the first error identifier to confirm the data, the first error identifier, and the memory address are correct by comparing the data in the delay buffer with the read inverted data. The original data and the memory address are then stored in the delay buffer.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 6 illustrates an example MSIM circuit performing a third step of a write in the WRWR process of FIG. 3, according to one embodiment of the present disclosure.

FIG. 11 illustrates an example MSIM circuit performing a second step of a controller read when there is a buffer match, according to one embodiment of the present disclosure.

DETAILED DESCRIPTION

Aspects of the present disclosure relate to a memory safety interface configuration. The memory safety interface configuration may include a circuit and a process for enabling a check of memory locations for write and read operations without a need for a memory built-in self-test (MBIST) or software test library (STL).

Figure 1:
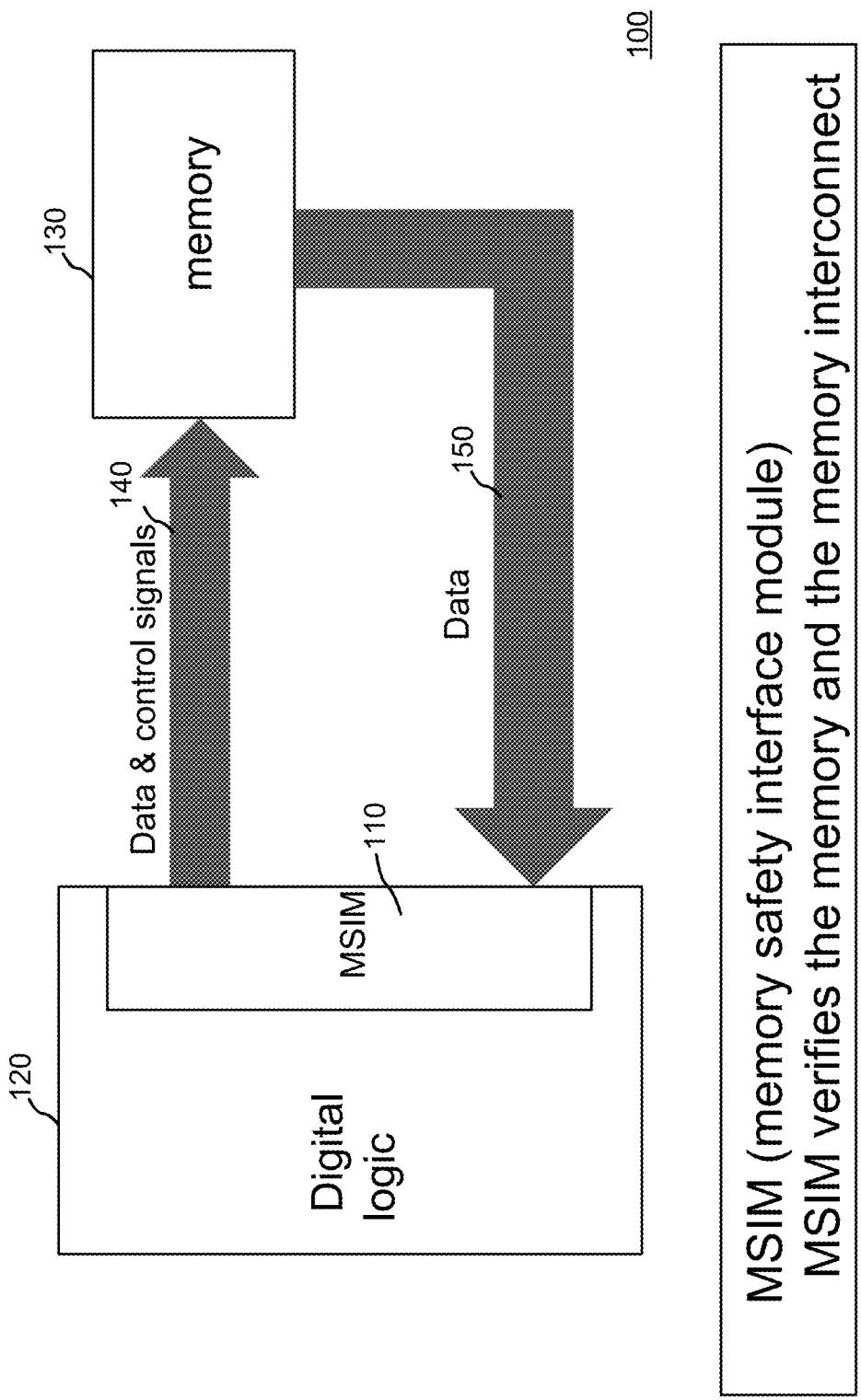
FIG. 1 illustrates an example circuit with a digital logic and a memory, according to one embodiment of the present disclosure.

Figure (FIG. 1 illustrates a circuit 100 with a digital logic 120 and a memory 130. Integrated with the digital logic is a memory safety interface module (MSIM) 110. The memory safety interface module 110 may be located external to the digital logic and between the digital logic 120 and the memory 130. The MSIM 110 may verify the connectivity between the digital logic 120 and the memory 130, and further verify the memory 130. The MSIM 110 reads and writes to the memory 130. The MSIM 110 does reads and writes in a certain order and with a certain pattern. The MSIM 110 can verify that the data and the control signals 140 are written towards the memory 130. The MSIM 110 also may confirm the data 150 returning from the memory can be checked so that there are no faults and no transient issues that have occurred. Further, the MSIM 110 may run during a mission mode. The MSIM 110 also may be used as replacement for both MBIST and for the STL.

An advantage of the disclosed configuration is a design that requires less physical chip area. Further, it has no software intervenient thereby making it more secure. For example, the disclosed configuration may be used for safety solutions or for security solutions because it does not create a security vulnerability that STL may introduce. Moreover, it does not need MBIST functionality because the MSIM 110 will only check locations in the memory 130 when they are used. Thus, while MBIST is verifying the complete memory 130, the MSIM 110 only checks the necessary memory location that is used by the application. If an application is using less memory, there also will be less testing and if it is using more memory it will do more testing. The memory safety interface module may be scalable with the application. This means that the delay from starting up from boot time is reduced dramatically because this gives a few-cycle delays versus MBIST that may have 100,000 cycles delay. The coverage of the memory safety interface module is to cover both the memory signals 140 towards the memory 130 and signals 150 from the memory 130.

Figure 2:
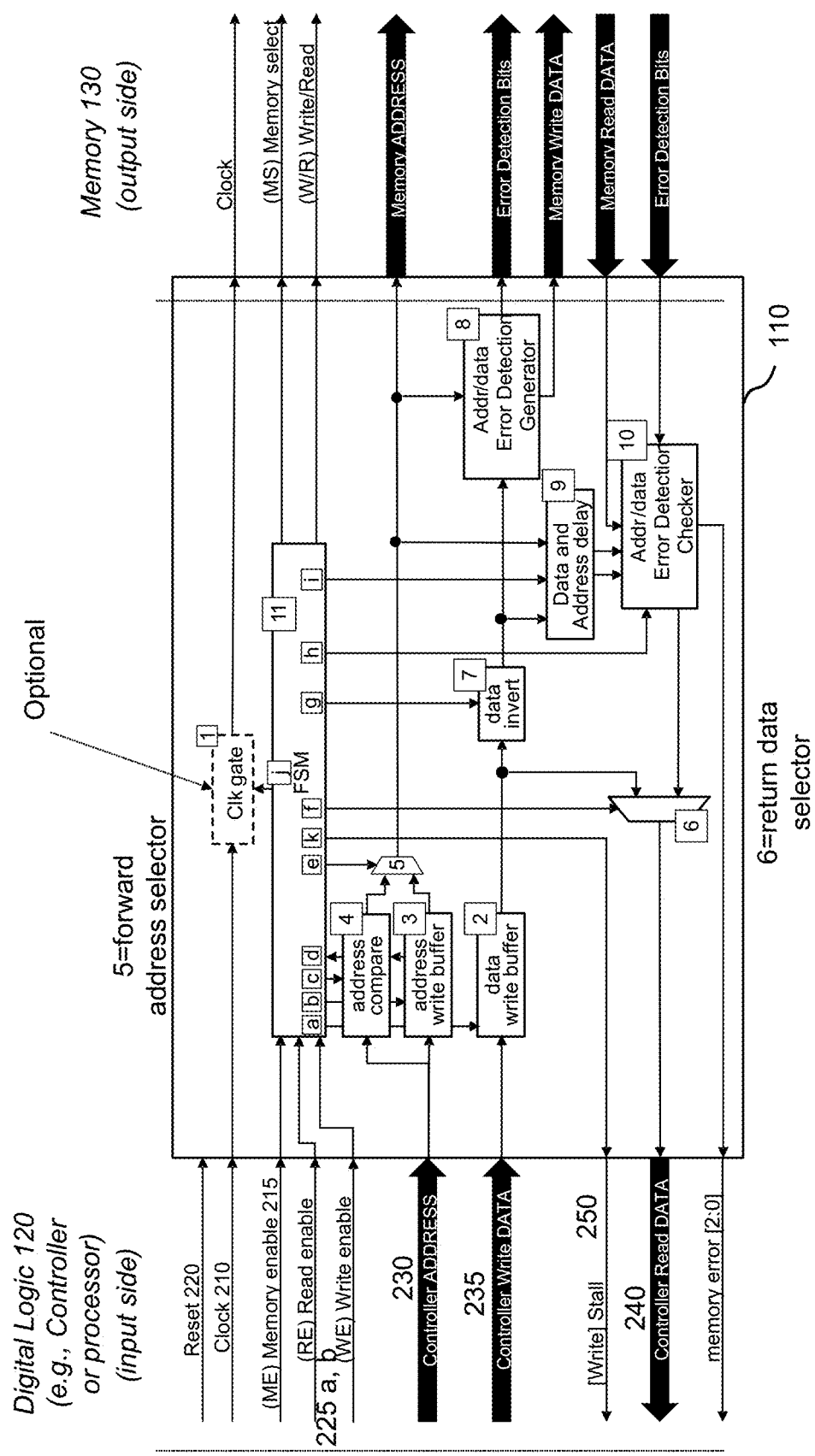
FIG. 2 illustrates an example memory safety interface module (MISM) circuit, according to one embodiment of the present disclosure.

Referring now to FIG. 2, illustrated is a memory safety interface module (MSIM) 110. On the right side of the MSIM 110 is a dotted line corresponding to signals into and from the memory 130 (memory side). The memory 130 side signals may include, for example, the following signals:

a clock 210;
an enable (or select) 215 signal of the memory to activate the memory 130;
a reset 220 signal to reset the MSIM 110;
an address selection signal 230 for a location in the memory 130;
a Write/Read (enable) signal 225 to indicate a read or write process into the memory 130 (the write/read signal may also be implemented as two separate signals, a write and a read signal);
write data signal 235 that contains the data to be written into the memory; and
read data signal 240 that returns the memory location content.

Also included may be a signal to include 'error detection bits,' which are sent with the data to be stored inside the memory 130. The error detection bits may be in addition to the raw data (i.e., the data bits) that together are stored within the memory 130. The error detection bits correspond to additional information that may be used to detect if there was an issue with the data or address during the time it was stored within the memory 130.

In the figures, on the left of the MSIM 110, is the interface towards the digital logic 120, which may be an intellectual property (IP) block such as a processor. The signals include a reset signal 220 and the clock signal 210 coming into the MSIM 110. In addition, the clock signal 210 coming into the MSIM 110 is the same as the one to the memory 130. There also is a write enable signal 225a to write into the memory 130 and a read enable signal 225b to read from the memory 130. These may be classified as the control signals. The controller address signal 230 may be used to read to or from a specific address in the memory 130. A stall signal 250 may be used to indicate to the digital logic 120, to wait before it can continue with the next memory write. This may be a halt signal for the digital logic 120 to push back on the IP block to make sure that that new data will not overwrite the previous data that is not yet stored in the memory. Furthermore, a read data output and some error signals that may indicate something went wrong. These are the error indicators that indicate a memory error or a memory interconnect error. The IP block 120 and the memory 130 includes a bridge in between.

The MSIM 110 may serve as a bridge to the memory 130 and contains a number of components (or sub modules). In FIG. 2, the components are as follows (TABLE 1):

1=Clock gate
  Enable of clock gate is controlled by FSM;
  Disables the clock towards the memory side when FSM is in idle state;
  Alternate embodiments:
    A) clock gating and tie-off memory select, no memory select startup mode;
    B) no clock gating and memory select control from FMS, memory startup mode required.
2=Data write Buffer (DWB)
  When "a=write enable & memory enable": input data is copied into a local buffer, and input data is also forwarded;
  When "a=0": local buffer is forwarded.

3=Address write buffer (AWB)
   When "b=write enable & memory enable": input address is copied into a local buffer.
4=Address compare (AC)
   When "c=read enable & memory enable": input address is compared against AWB;
   When "d=(input address=AWB)"→FSM is informed and data within DWB is returned in the next cycle via RDS.
5=Forward Address Selector (FAS)
   Selection is made if input address or AWB is used;
   Default selection is AWB;
   When "e=memory enable & read enable": input address is selected.
6=Return Data Selector (RDS)
   When "f=0" (default): EDC data output is selected;
   When "f=1": DWB data output is selected;
   "f" is one-cycle delayed version "d".
7=Data Invert (DI)
   When "g=1": all data bits are inverted for 1 cycle.
8=Addr/data Error Detection Generator (EDG)
   Based on the incoming address and incoming data, the error detection bits are generated;
   Incoming data and calculated error detection bits are forwarded to the memory;
   Example: "Data concatenated with Address" SECDED ECC with All-0 & All-1 detection.
9=Data and Address Delay (DAD)
   When "i=1": Memory address and memory data are copied into local buffer;
      Memory address required for EDC checking (long term memory location is not broken);
      Memory data required for data comparison (check that memory location is not broken);
      i=(memory select=1 & write=1), then output side memory write is done.
10=Addr/data Error Detection Checker (EDC)
   Incoming Error Detection Bits (EDB) are compared against memory read data and DAD address provided;
   A second check is done that memory read data is equal to the DAD data provided;
   A memory error [0] signal is triggered;
      when the EDB data related comparison failed (comparison done on each memory read);
      when the memory read data and DAD data comparison failed
      (this comparison is controlled via "h=1");
   A memory error [1] signal is triggered
      when the EDB address related comparison failed (comparison done on each memory read);
   The memory read data is always forwarded to the RDS OPTIONAL depends on the EDB functionality:
      A memory error [2] signal is triggered in case of a memory read data error detection has been corrected;
      The corrected data is then forwarded to the RDS instead of incoming memory read data.
11=FSM (FSM)
   Determines which paths between input-side and output-side is taken;
   Keeps track of the WRWR memory check;
   Is a kind of arbiter between WRWR check and controller side reads;
   Controller side reads have priority over WRWR
   Provides stall signal to the digital logic to provide information on when the next write can be started.

Continuing with reference to FIG. 2, an optional clock gate 1 may be used to ensure that the clock towards the memory 130 is only present when there is a memory access. The clock gate 1 may be used to help reduce power consumption of the memory 130. In this case, this clock gate 1 generates a clock pulse when required. This configuration also helps with detection of glitches or circuit errors. If there is no clock, but the data has changed, this is an error on this clock line. If there is no clock gate, then it still would detect errors.

The data write buffer 2 allows a write on the interface of the digital logic and forwards it as a write to the memory 130. The write is a write of data from the digital logic 120 towards the memory 130. To store something in the memory 130, an enable and clock signal 210 activates the memory 130 and a write enable signal 225a is asserted to write the controller write data 235 into the memory 130. Here, the data write buffer 2 captures that controller write data 235 and stores the data locally until it gets the next write. The same applies for the address write buffer 3, which stores the controller address signal 230 that is used to signal the memory location in the memory 130 in which to store the data.

If a memory enable signal 215 and write enable signal 225a are enabled from the digital logic 120, the controller address 230 is copied from the digital logic 120 into that address write buffer 3 and keeps it local until a next write.

Address compare unit 4 compares the address of the address write buffer 3 with the next address that is being provided. By way of example, a write may take a few cycles and because reading of data is very important. A read has priority over the write, and the address compare unit 4 compares the read address pointer with the address write buffer 3. If there is a match, i.e., the two addresses are the same, there is no need to go to the memory 130. The read data may then be taken from the data write buffer and provided back into the digital logic 120.

Continuing with FIG. 2, forward address selector (FAS) 5 may be implemented as a multiplexer (MUX). FAS 5 is used to select between a read address or address write buffer 3. If a read enable signal 225b comes in and the address is not equal to what is in the address write buffer 3, the logic may be configured to read another location from the memory 130 and may need to be given a priority. Thus, with FAS 5, priority is given to that read address and the read address directly goes to the memory 130. From the memory 130, the data is fetched, and that read data is given back to the digital logic 120.

The Return Data Selector (RDS) 6 also may be implemented as a multiplexer (MUX). RDS 6 is a unit to select whether to provide the internal write data buffer content directly back or whether to provide the read data of the memory 130 back to the digital logic 120.

The data invert 7 is configured to invert all the bits of the original data that was in the data write buffer 2. If, for example, in the data write buffer 2 there is a data value of 0010, then this data inverter will invert all the zeros to one, all the ones to zero, which in this example would be 1101. The data inversion allows to write the inverted data into the memory 130. The inverted data can later be read from the memory 130 to check that the data at memory location is correct. Hence, a write of the original data also is done with a check of the original data. Because every bit will flip, it also will test all the bit locations of the memory 130. Further, because it can verify all the bit locations of that single memory location, it can evaluate that there is no data error or that there is no transient error of the memory location inside the memory 130.

The bit-by-bit comparison check looks for inversion to a check whether the written data is to the correct memory location and perform a check of the memory address it is written to in the memory 130. The memory address is checked by the address/data error correction generator 8 by putting the memory address and the data into it. The error detection generator 8 calculates an error correction value over the input (address and data). Specifically, the input into the address/data error correction generator 8 is the address to write to the memory 130. The address and the data input are concatenated. Using the address and data, a redundancy value is calculated. The redundancy value may be an error identifier, e.g., an error correction code (ECC) or an error detection code. For example purposes, reference will be made to ECC in the examples herein, through the principles would apply for other error identifiers.

The ECC may provide a type of hamming distance, with which extra bits are calculated. Those extra bits are also stored with the data. Because there is also an address, when a read is done, those error detection bits come back with the data. Based on the error detection bits that are coming back with the data, a calculation may be done to determine if the error correction bits that were stored in the memory 130 match the provided address and returned data. If there is a match, the read data and the memory address belong together so that they may be confirmed as correct. Hence, the memory address, the inverted data and the first ECC are read from the memory 130 to confirm the data, the first ECC and the memory address are correct. Specifically, data read from the memory should be equal to the data in the data and address delay buffer 9. The ECC read from the memory 130 should correspond with the data read from memory and address stored in data and address delay buffer 9. This may be done be using an ECC decoder function. It is noted that where ECC identifies an error in the data, e.g., by the address/data error detection checker 10, the data can be corrected and transmitted back to the digital logic 120.

The calculation of those extra bits also allows for verification of those extra bits in the address/data error detection checker 10. Thus, the configuration may ensure that the address used for reading to the memory is stored locally. A data and address delay buffer 9 stores a delayed version of the memory address. If there is a read on a memory 130, the address and the memory select are asserted on the memory 130. When clock signal 210 is triggered, the data is provided back. The ECC bits check ensures that the correct memory address was used. Hence, a local copy of the address is needed for this check and this data is stored in a local block that is the data and address delay buffer 9. With the data and address delay buffer 9, the data within is checked and verified against the data received from the memory 130. A match between the two is indicative to no problem with the memory 130. A mismatch is indicative of a problem with the memory 130. It is noted that the data and the address delay buffer may be one physical storage device that may be partitioned or may be two separate physical storage devices (e.g., a data buffer and an address buffer) that may operate in tandem.

If there is an indicated problem, the configuration determines if there is a problem with the address in memory 130 or the data itself. If the ECC bits determine that there is no issue with the data, that may indicate an issue with the memory address because the data may have been fetched from the wrong address location. If there is a data mismatch, it may be indicative of the memory location being corrupt because the data written into the memory 130 and the data received from the memory 130 are mismatched. Accordingly, the memory location may be verified as either corrupted or not or malfunctioning or not. The address/data error detection checker 10 does the comparison between the data that was written on a certain address and comparing it to the real data that was inside the memory 130. This also may indicate that at a first write, e.g., the first time that it is being written, the inverse bits are written. The inverse bits are also located in the data and address delay buffer 9. Those inverse bits are written into the memory location. When a subsequent read is done, the data comes back and is compared with this locally stored data in the address delay buffer 9. If they are equal, that memory location is usable and there are no errors. If the data is not equal, there may be a memory error and that memory location should not be used because it may be corrupted.

The output from the address/data error detection checker 10 is the data itself, if there is no error, then it goes through RDS (e.g., MUX) 6 and out to the digital logic 120. If there is an error, an error signal goes out to the digital logic 120. The memory error information is on a bus and may be, for example, 3 bits. These bits allow for reporting particular errors to the digital logic 120. For example, one error may inform that the memory location is corrupted. Another may inform that the data is corrupted. Still another example is that there may have been an address corruption, but that the memory 130 is working. Yet another example, is the address may have been wrong and the error may have been with the address input bits. Because the address also is stored locally, with the data that is read back, it can compare the error detection bits to determine if there was no error in the data. It also can determine that if there is an error in the address because the detection bits give back information about what the original address that was used to store that data. Those should match the address that was input.

Turning to the finite state machine (FSM) 11, it operates as a controller of the MSIM 110. The FSM 11 may be instantiated through a logic circuit or a processor with program code configured to operate as described herein. By way of example, the FSM 11 determines if there is a read or write action. Based on that it will go through a state diagram to do the different actions. If the FSM 11 gets a memory enable and a write enable, it will assert signal A and signal B. The FSM 11 makes a local copy of the data and the address in the data write buffer 2 and the address write buffer 3 respectively. When that is done, the FSM 11 forwards the data and the address to the memory 130. The data is inverted, so signal G (see Table 2 above and FIG. 2) will be activated. The data will be inverted, a write command goes into the memory 130. The FSM 11 initiates in the next cycle, a read for the same memory location. It reads back for that memory location and does a comparison to find out if something was wrong or not. In the state machine after it has performed the read, it will do another write. That write will not invert the data because in the second write it is the requested data that will be stored into the memory 130. Thus, there is a write to the memory 130 with the non-inverted signals. The FSM 11 starts the second read to verify that that second write went without error. If it is not correct, the address/data error detection checker 10 will generate an error. If it is correct the state machine will indicate no error and a next write or read may be done from the digital logic 120.

As the FSM 11 is undertaking the reads and writes, FSM 11 also signals the digital logic 120 that the FSM 11 cannot do another write because it is busy and using the memory 130. To manage this, the FSM 11 generates a K signal (which is a stall signal) that will indicate that the FSM 11 is busy, for example, with the write action. If the digital logic 120 tries to initiate another write, it will need to wait until the K stall signal is done. If the K stall signal is active, the digital logic 120 is still allowed to perform reads. Here, the FSM 11 will get a new action that requests a memory read. The FSM 11 checks whether it has a local copy of, e.g., the write functionality that it was doing, or it will forward the memory read. The FSM 11 will stop the write, read, write, read (WRWR process). The FSM 11 will first do a read and then when that is done, the FSM 11 will continue with the write, read write, read (WRWR) process. The FSM 11 monitors if there is a new read coming in while it is still handling, e.g., the write, that the read has priority over the write. The FSM 11 will first perform the read before it continues with the write. The flow of these operations also is reflected through TABLES 1 and 2 above.

The disclosed configuration advantageously tests memory locations before using them. The present system may do this by doing first a write, e.g., the inverted data, which may mean destroying the value in the memory. Thereafter, there is a check that that has been done and then the second write is the real storage of the data. By reading the data after that the disclosed configuration is able to have an operation like an MBIST, but now that MBIST type operation is on a single memory address location. This contrasts with MBIST, which does a check on all address locations. Hence, in contrast to MBIST, the disclosed configuration checks only the address location that may be of interest to use, rather than having to check all memory locations. This also means that if there are other address locations that are corrupted it may not matter because at the moment those will not be used. The disclosed configuration, for example, verifies in four-cycles the immediate location of interest in memory 130 that is available and can be used in the memory 130. This saves processing time and resources.

Figure 3:
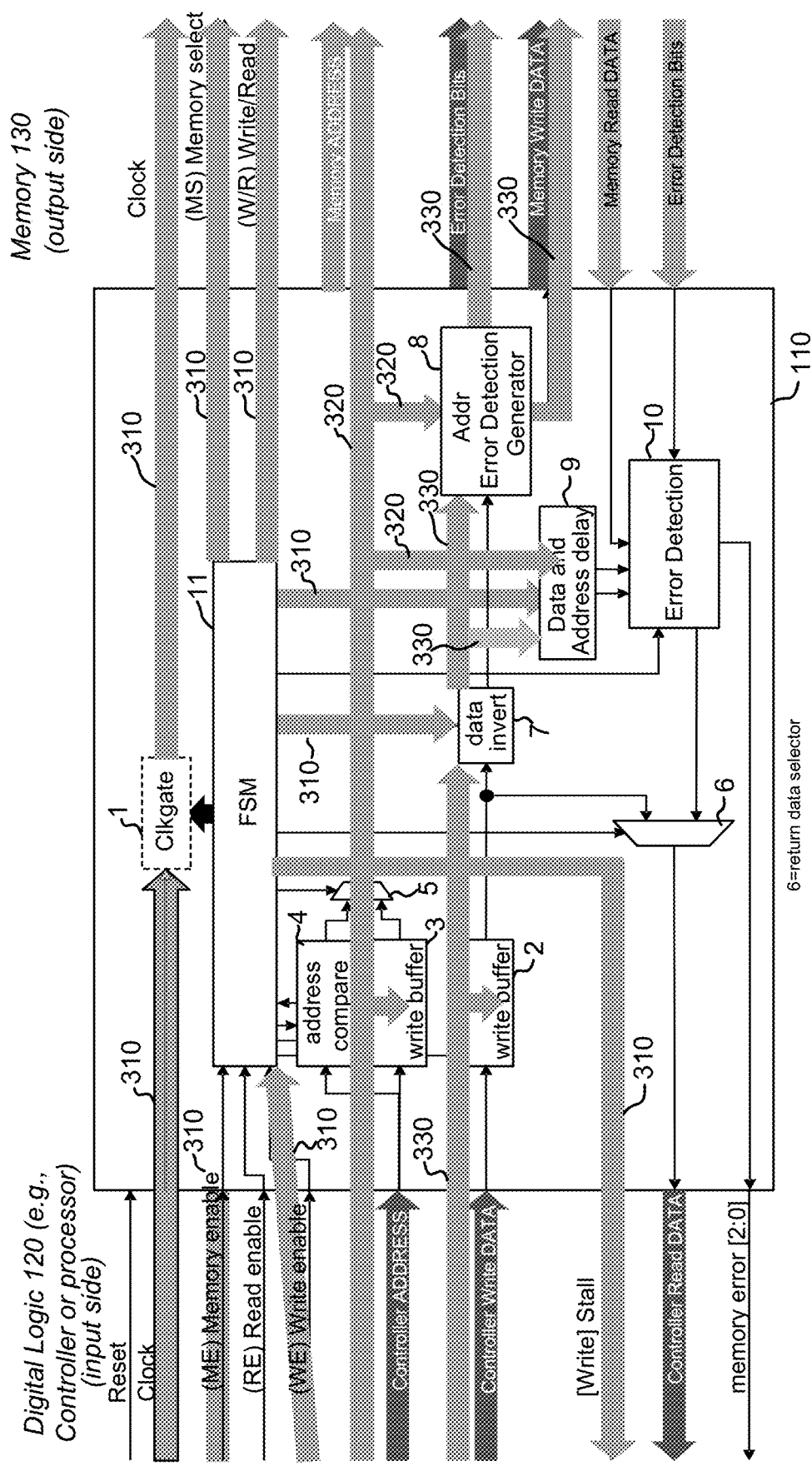
FIG. 3 illustrates an example MSIM circuit performing a first step of a write in a write, read, write, read (WRWR process), according to one embodiment of the present disclosure.

Turning next to FIGS. 3 through 8, illustrated are examples for a clock cycle as to operation of the MSIM 110. In FIG. 3, illustrated is step 1 of a Write Read Write Read (WRWR) operation. Note that the lines are for control signals 310, for address signals 320, and for data signals 330. In the first step is a memory check. There is a memory enabled and a write. This means that write into the memory is sought. That information of write enable data 235 and memory enable 215 is transmitted to the FSM 11. The FSM 11 ensures the address and the data are stored in the local address write buffer 3 and local data buffer 2.

In the meantime, the FSM 11 communicates with the memory 130 to not lose a cycle. In addition to copying an address into the address write buffer 3, the FSM 11 directly transmits the address towards the memory 130 with the write data. The data inverter 7 is enabled to store the inverted data into the memory 130. When the data inverter 7 is enabled 330, the inverted data is stored locally in the data and address delay buffer 9, where the inverted data will be used during the next cycle. Similarly, the control address goes into the address/data error detection generator 8, for generation of extra detection bits and will be used to determine if it is a data or an address error when the data comes back from the memory 130. The data with extra detection bits and the address are forwarded to the memory 130 for storage.

During a write operation, the FSM 11 also signals that the next write needs to be held because it cannot do two writes at the same time. It needs to wait until the current write operation is finished. Reads, however, are not blocked by the FSM 11.

Figure 4:
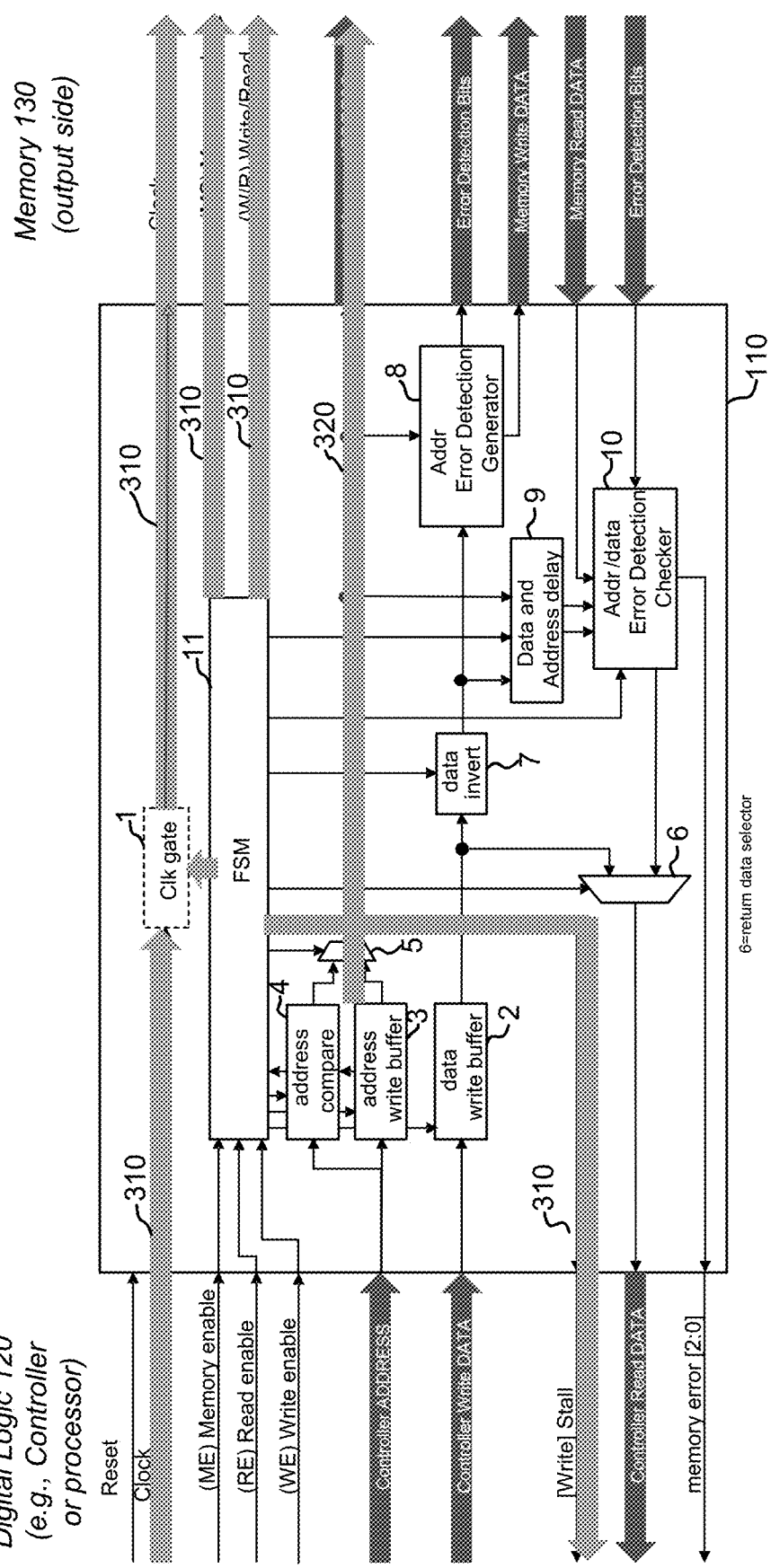
FIG. 4 illustrates an example MSIM circuit performing a second step of a read in the WRWR process of FIG. 3, according to one embodiment of the present disclosure.
Figure 5:
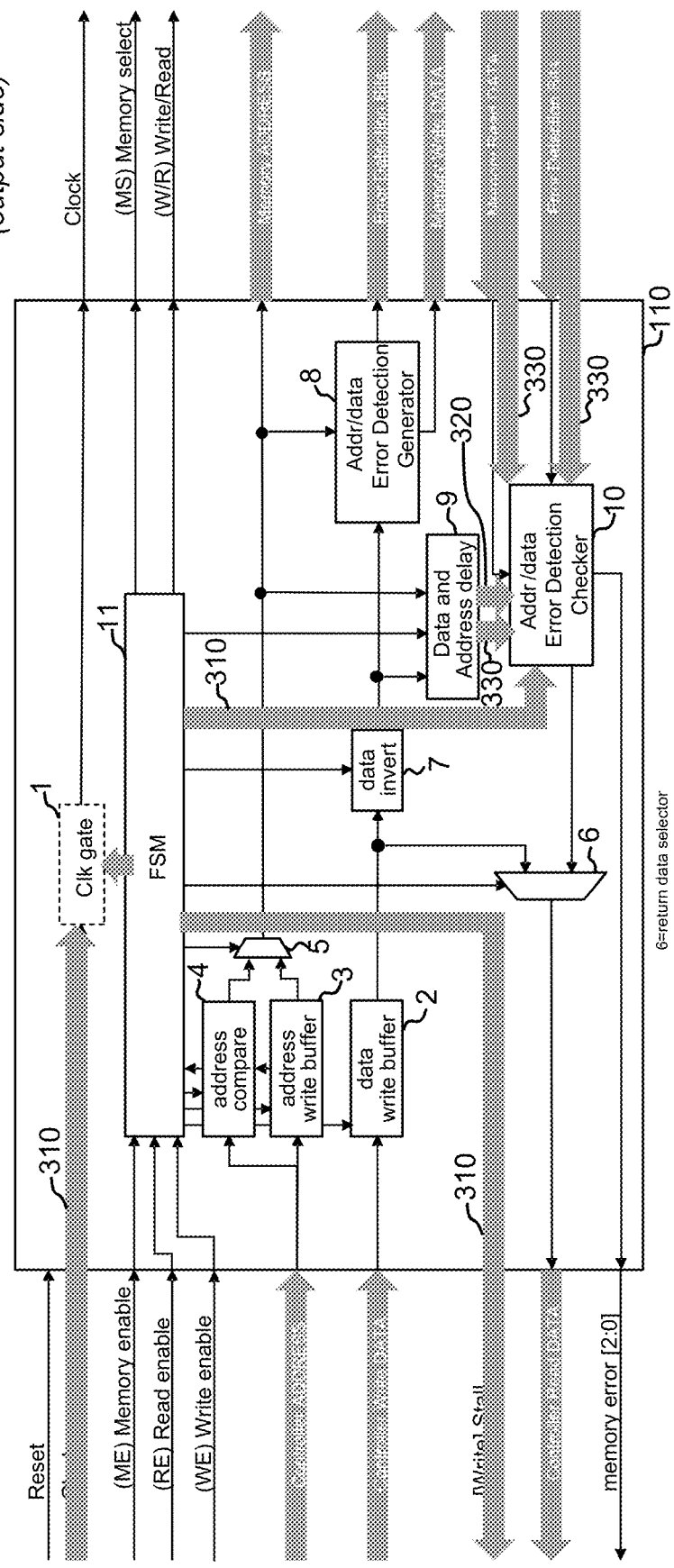
FIG. 5 illustrates an example MSIM circuit performing a second portion of the read following FIG. 4, according to one embodiment of the present disclosure.

FIGS. 4 and 5 illustrate the second step of the WRWR operation. FIG. 4 is step 2a in the WRWR operation. Here, the local address is stored by address write buffer 3. There may be any new address at the boundary between the digital logic 120 and MSIM 130 if the digital logic 120 seeks to transmit to the memory 130 together with the read and control signals. In the meantime, while conducting a read, the MSIM 110 stalls writes to the digital logic 120. The memory 130 in the next cycle returns the data, shown as data signal 330 in FIG. 5. The MSIM 110 returns the extra data detection bits with the data that goes into the address data detection block (error detection checker 10). The error detection checker 10 is enabled, shown with the control signal 310 input to the error detection checker 10, to verify that the address and the data sent in the previous cycle is returned. The error detection checker 10 also checks that the data sent to memory 130 and data returned from memory 130 into digital logic 120 is equal. The address and the data together are verified against the detection bits to determine whether there is any error in the detection bits or whether the read data corresponds to the wrong address. Hence, the configuration checks the address lines and the data lines and the detection bits. If the error detection checker 10 does not determine any error, the configuration can continue with the next stage.

Figure 6:
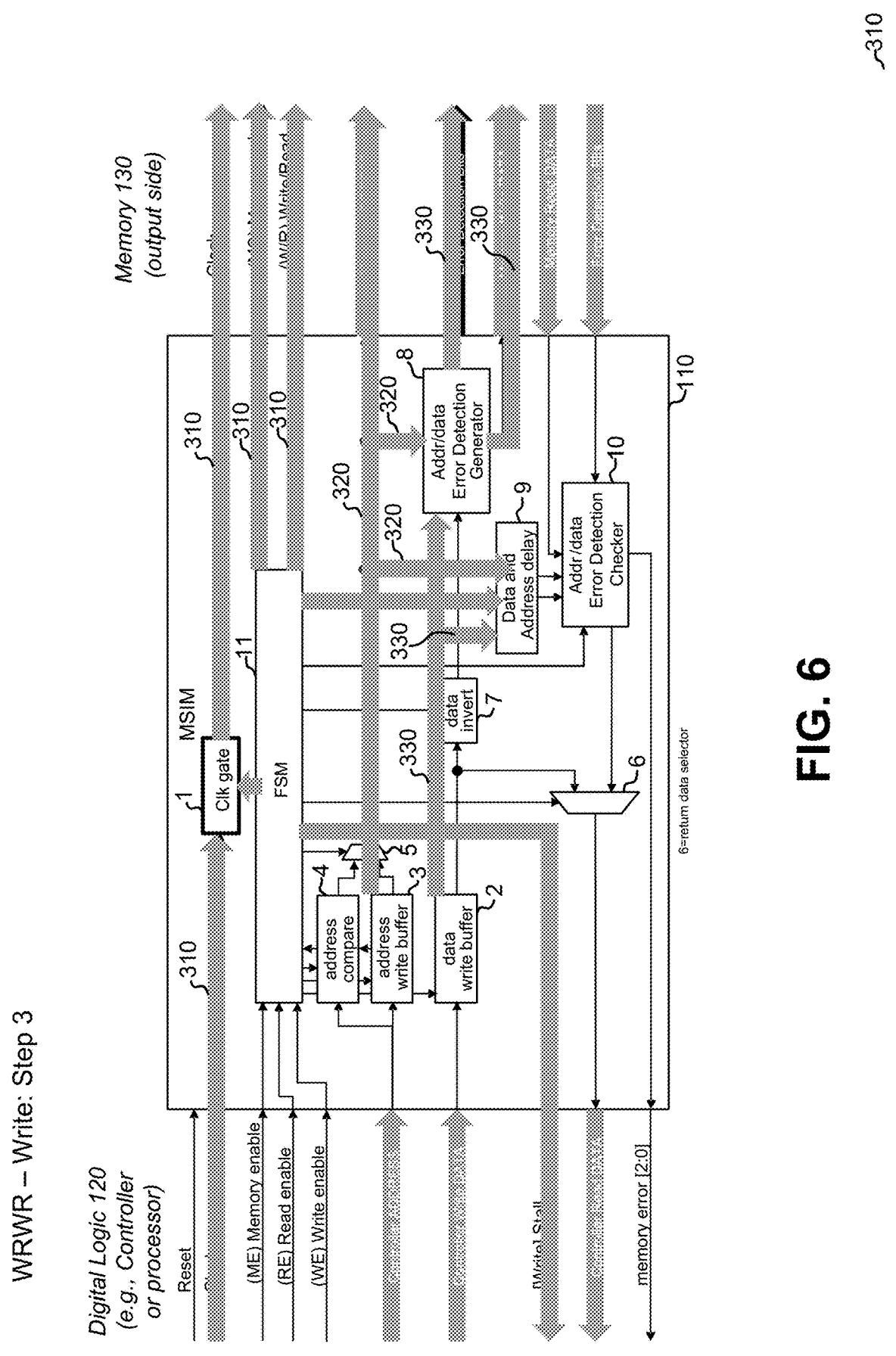

FIG. 6 is the next stage, or step 3, in the WRWR operation. Here, the data inverter 7 is disabled. The original data is ready to be stored into the memory 130. Further, the original data is to be stored at the particular address location in the memory 130. The control signals identify the address location to write in the memory 130. To ensure detection of what is stored, the configuration also stores the detection extra ECC bits with the data into the memory 130. When the write data is verified, it allows checking for no other error, e.g., on the detection bits or on the address. The data and address delay are activated to copy the new data being written to it, e.g., the local data and address delay buffer 9. When activated, if the write is a high signal the configuration may still not be ready for the write-read-write read (WRWR) operation (also referred to as a mini-check herein). Hence, a stall signal, e.g., a stall signal 250 (K), may be active.

By way of example, the MSIM 110 may receive an original data from a digital logic. The bits of the original data may be inverted to generate an inverted data. The inverted data is written to the memory 130 address. The inverted data is then read back from the memory 130 address. The address and data error detection checker 10 determines whether the memory address and the inverted data are correct. If the inverted data and memory address are correct, the original data may be written to the memory 130 address. If the inverted data and memory address are not correct an error indication may be provided, e.g., to the digital logic 120.

Figure 7:
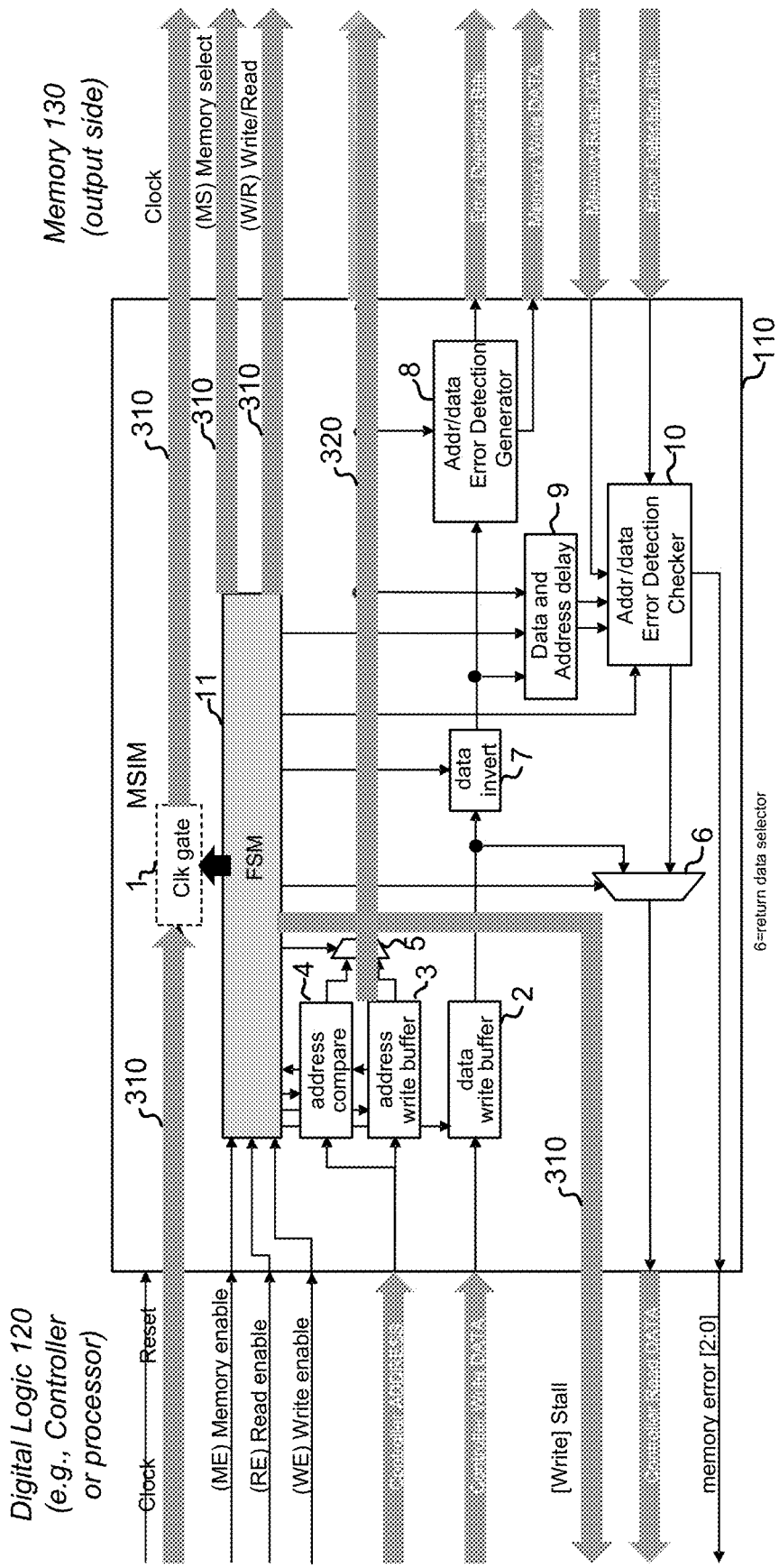
FIG. 7 illustrates an example MSIM circuit performing a fourth step of a read in the WRWR process of FIG. 3, according to one embodiment of the present disclosure.

FIG. 7, which is step 4a of the WRWR operation, a next clock cycle is shown. In this example, the next clock cycle is a read. Here, the address just written to is read back to check the data. The check may be to determine whether the data has been stored correctly and the information inside the memory 130 is valid and has no errors in it. The address from the address write buffer 3 is provided to the memory 130. Also, the FSM 11 is creating a read control signal for the memory 130. As the mini check may not yet be completed, the write stall signal, e.g., the stall K signal 250, is active. This may enable the memory 130 to provide back the data in the next cycle.

Figure 8:
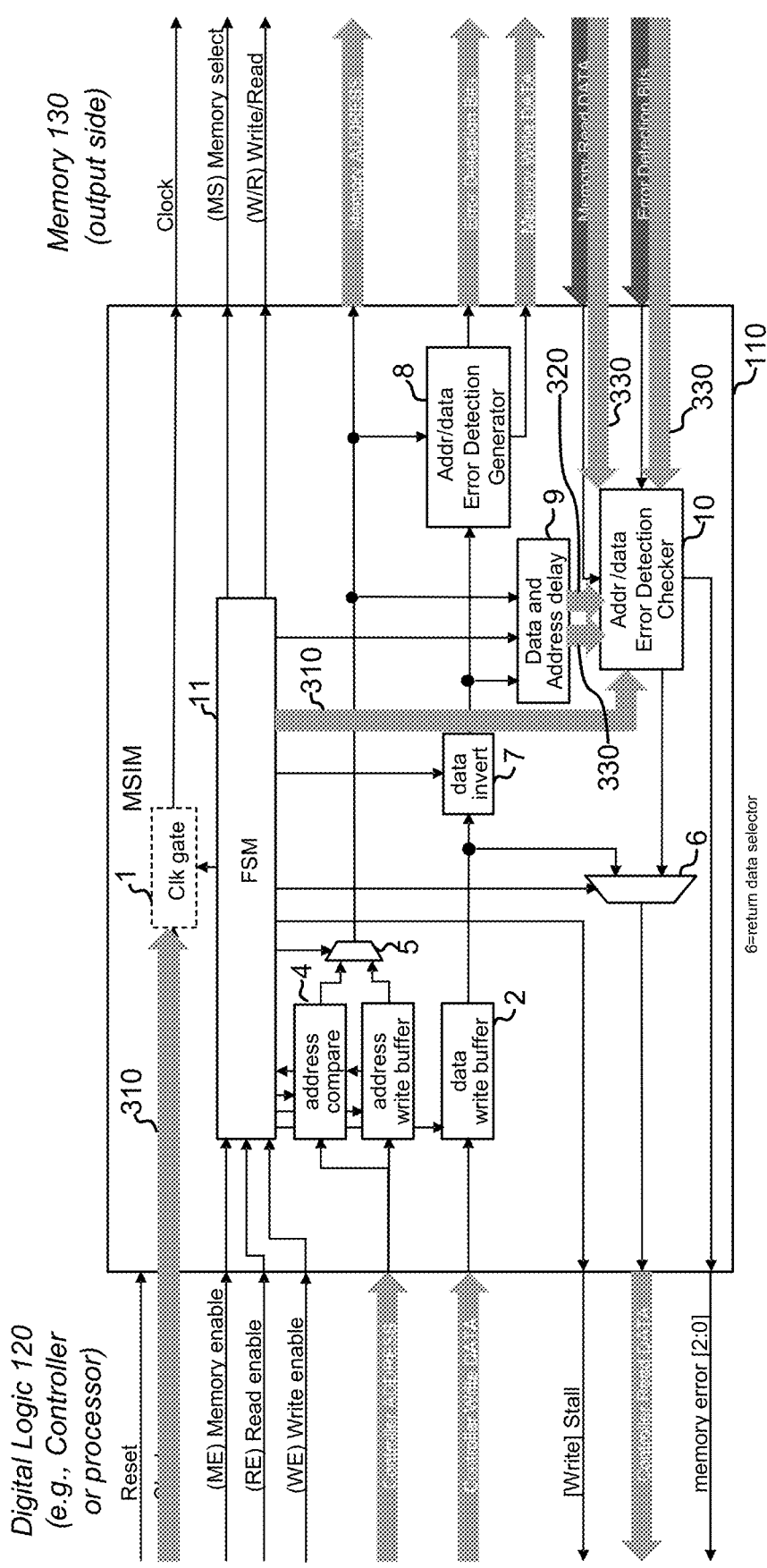
FIG. 8 illustrates an example MSIM circuit performing a second portion of the read following FIG. 7, according to one embodiment of the present disclosure.

Referring now to FIG. 8, illustrated is Step 4b of the WRWR operation in the MSIM 110, which is the read. This operation may be one clock cycle after the operation of Step 4a (FIG. 7). The memory 130 is returning data of the address location that was requested. The data is returned together with its protection bits. The returned data is compared against the local data and address to which it was stored. The data is compared to determine whether there were any data errors in the memory 130. The error bits are compared with the address and the data to ensure there are no errors with either the address location or the data within it. In the meantime, as this is the last stage of the mini check, the write stall signal, e.g., the stall signal 250, is removed because the local address write buffer and data buffer are no longer needed. The original data is stored into the memory 130 and what is inside the memory 130 is confirmed as not corrupted, valid, and correct. If a read is now received, for example, for that memory location address, it may go directly to the memory 130. The digital logic 120, which may be an IP block such as a processor or controller, can now enter a normal phase. The normal phase of the digital logic 120 allows, for example, a read to directly go to the memory 130.

Figure 9:
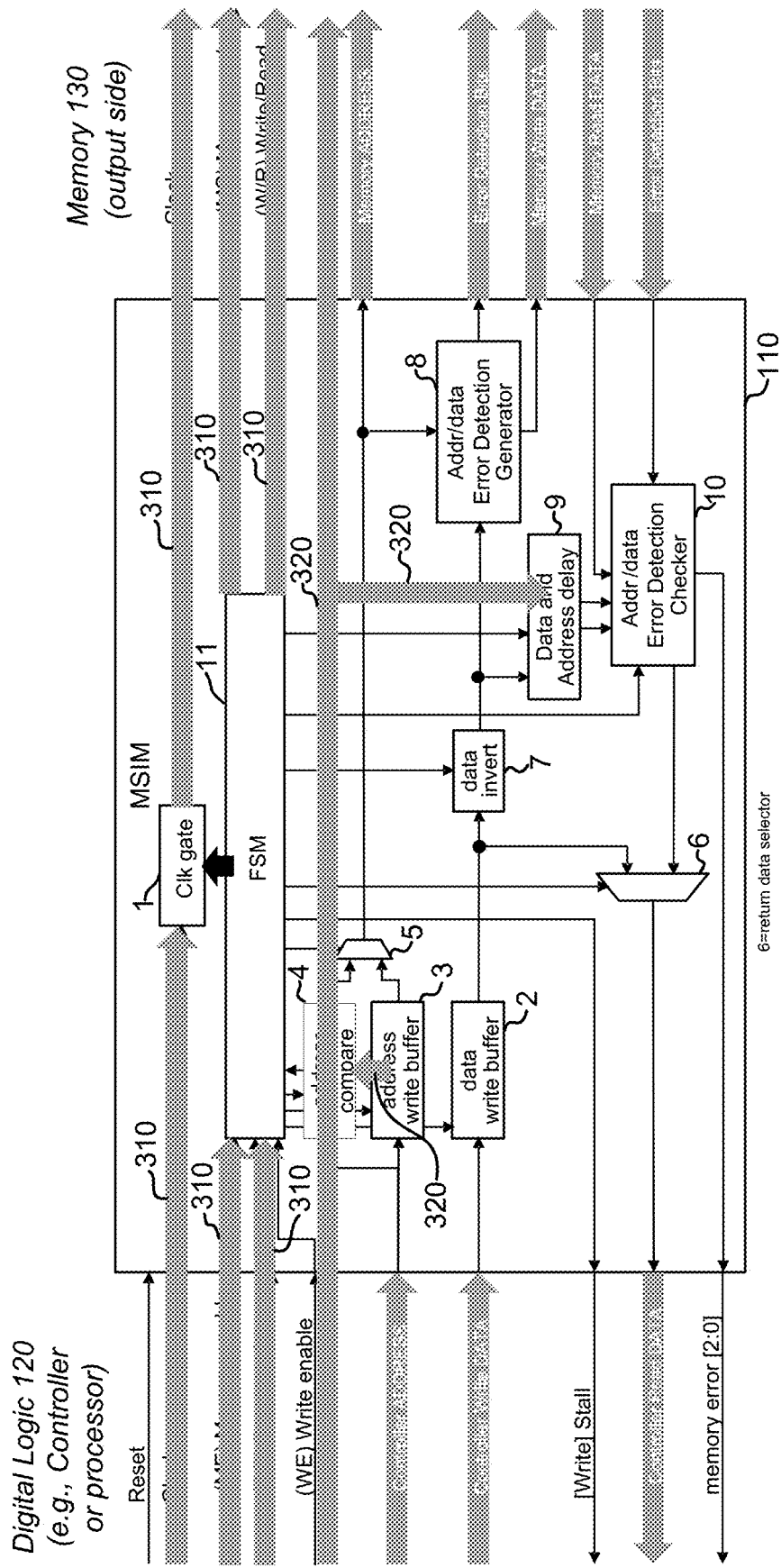
FIG. 9 illustrates an example MSIM circuit performing a controller read for a first step of a buffer miss process, according to one embodiment of the present disclosure.

Referring now to FIG. 9, illustrated is an example of operation for a digital logic 120 as a controller operation. In FIG. 9, illustrated is a configuration for an address buffer miss, i.e., that an address match was not made. Here, this may be checked in address compare 4 between the incoming address and the address stored in address write buffer 3. If there is a read from the controller, there is a first check if the data is still in the local data write buffer 2. If it is not in the local data write buffer 2, it directly goes to the memory 130. The MSIM 110 stores the address into the address delay. The address signal 320 to the data address delay is not active and if that is not active it will only store the address into the data and address delay buffer 9.

Figure 10:
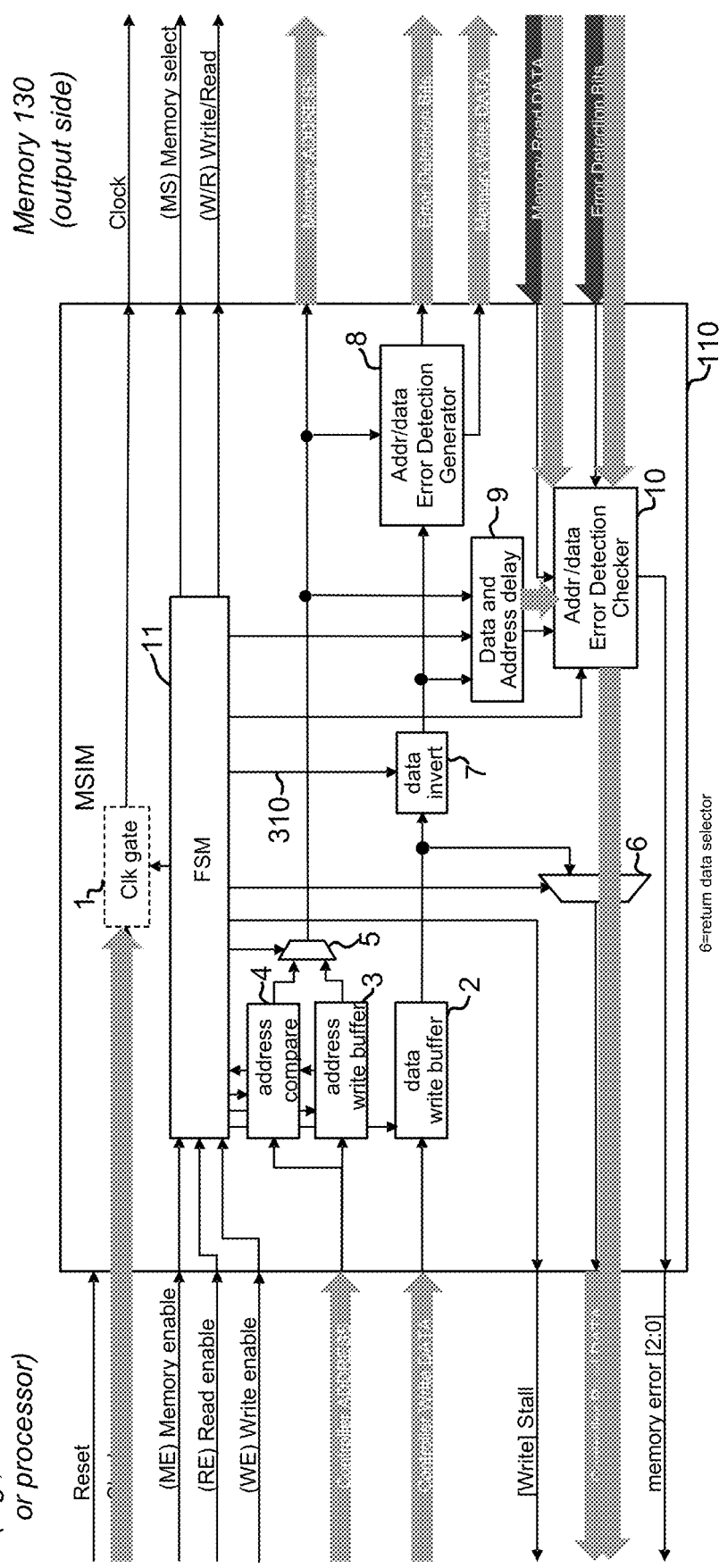
FIG. 10 illustrates an example MSIM circuit performing a controller read for a second step of a buffer miss process following FIG. 9, according to one embodiment of the present disclosure.

FIG. 10 illustrates step 2 of the controller read, buffer miss, in the next clock cycle. Here, the memory 130 will return the data of that address location in the memory 130. It also will return the detection bits were previously stored. The address together with the data and the detection bits are verified against each other. By verifying against each other, the MSIM 110 determines if the data is potentially corrupt. If the data and the detection bits belong together, but they do not belong to the particular address location in memory 130, this may indicate possible corruption. If there is an error, e.g., of the memory address transmitted the memory 130, which may occur because there is a stuck at or transient error, it may be due to the address signal 320 to the memory 130 was not equal to the address signal 320 sent to the data and address delay buffer 9. The data received from a memory location and the detection bits received from same memory location in the memory 130 should belong together. If not, the detection of the address against, e.g., the error detection bits, will fail and trigger an address issue. If there are no failures, the data is returned to the controller and the controller, which receives the correct data.

Figure 11:
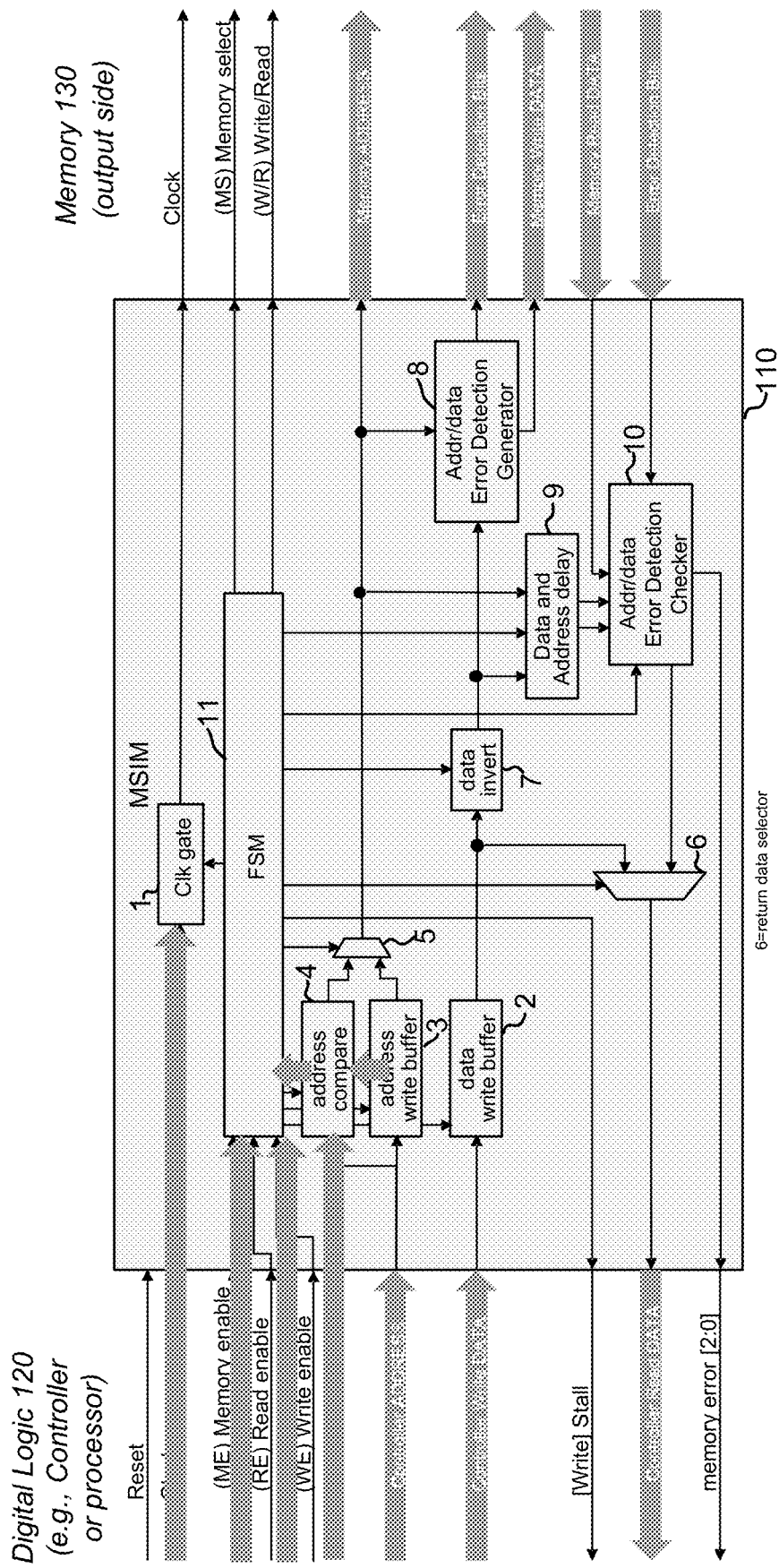
FIG. 11 illustrates an example MSIM circuit performing a first step of a controller read when there is a buffer match, according to one embodiment of the present disclosure.

Referring now to FIG. 11, illustrated is a controller read where there is a buffer hit, or match. The digital logic 120, e.g., controller, seeks to read from an address in the memory 130. On a clock signal, a memory enable and read enable signal are sent to the FSM 11. The controller address signal is sent to the address compare 4. In this example, the addresses compare match and the match is sent to the FSM 11.

Figure 12:
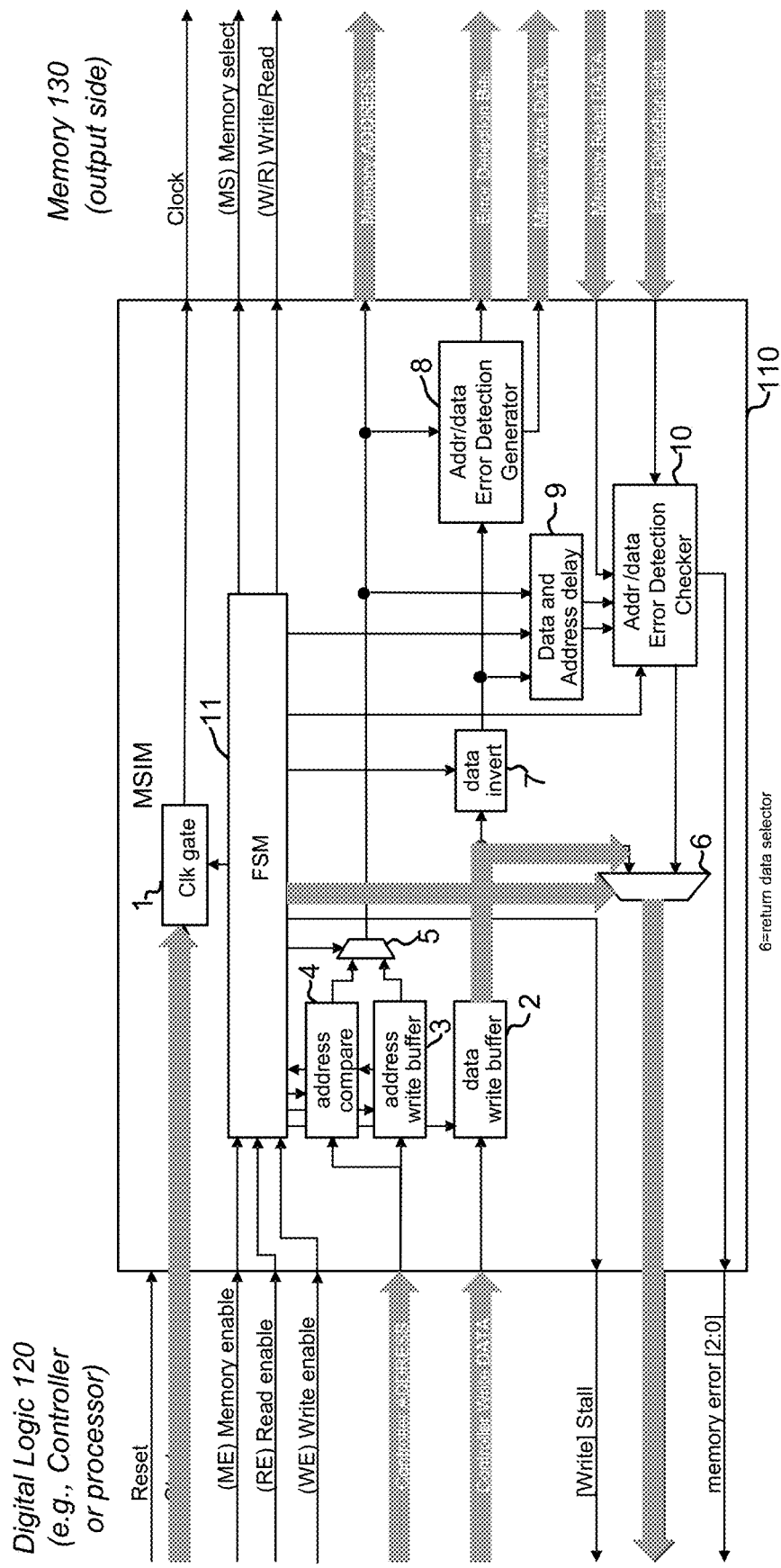

FIG. 12 illustrates operations by the FSM 11 for the digital logic 120, e.g., controller, read with a buffer match. On a clock signal, the FSM 11 enables the data MUX 6. The data MUX 6 allows, via signal F (see Table 2 and FIG. 2), the local data from the data write buffer 2 and directly transmit that back to the digital logic 120.

Figure 13:
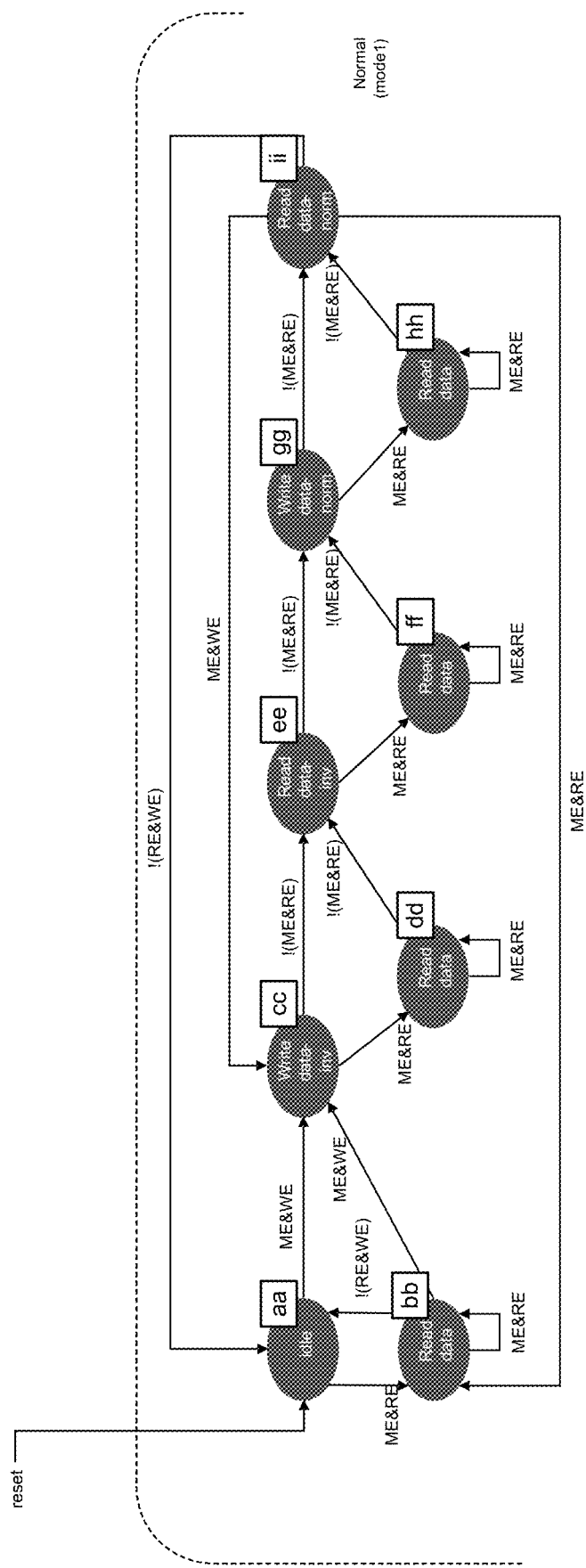
FIG. 13 illustrates an example state diagram without a memory select check, according to one embodiment of the present disclosure.
Figure 14:
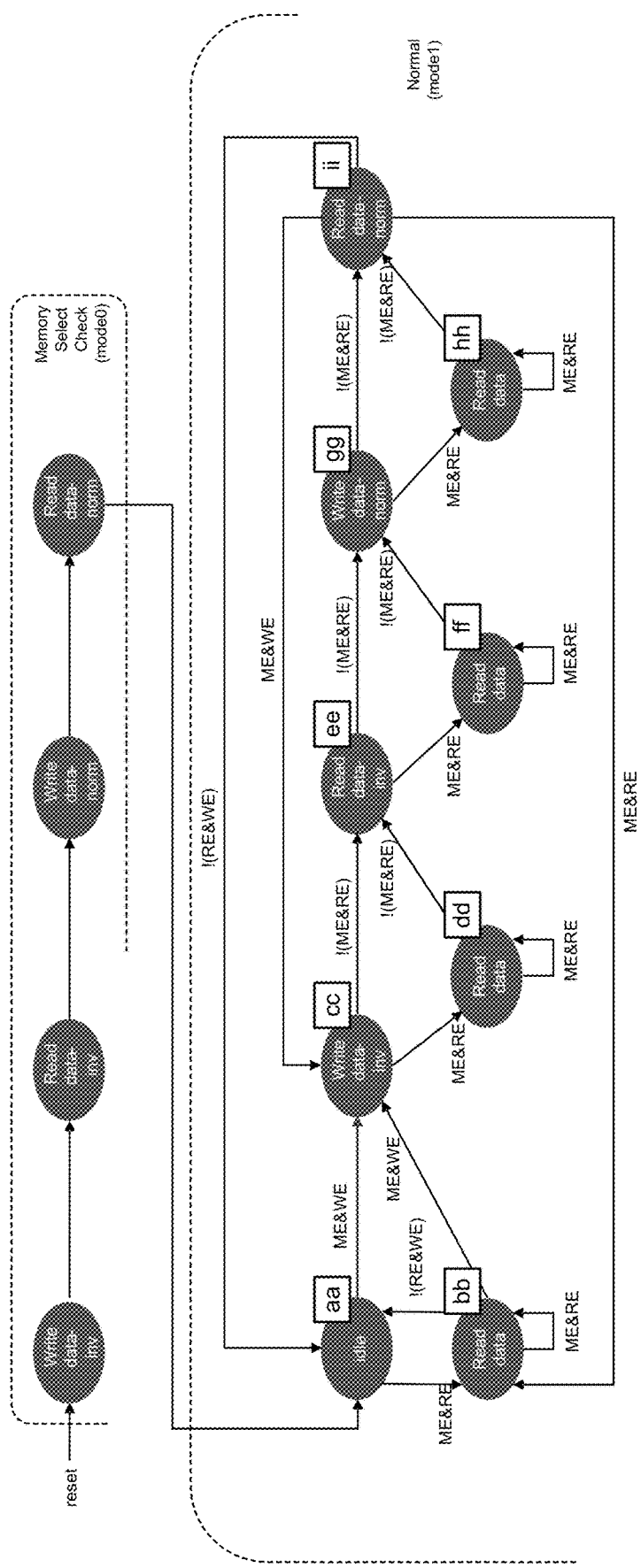
FIG. 14 illustrates an example state diagram with a memory select check, according to one embodiment of the present disclosure.

Turning next to FIGS. 13 and 14, illustrated are state diagrams for operation of a controller. The controller operates in two modes—mode one or mode zero. Mode one is mission mode. Mode zero is a special mode where after reset a WRWR check is first done to verify the memory control signals, and if successful, the controller proceeds to mode one.

Table 2 shows the controller modes:
Mode0: memory selection check
  Overwrite memory select (memory select de-activated);
  Start WRWR (use "custom pre-defined" reset address and "custom pre-defined" reset data.
Mode1: normal mode
  Automatically after mode0 is done.
Alternate embodiments:
  If clock gating implemented, then stuck-at-1 of memory select could be ignored;
  Clock gating and memory selection are redundant (only clock if memory action is done);
  In case of clock gating, memory selection could be tied-off and mode0 not required.

Turning to FIG. 13, after a reset the MSIM 110 goes into mode one which is normal mission mode of the MSIM 110. The reset brings the MSIM 110 into an idle mode. With the FSM 11 in an idle mode, if the MSIM 110 receives a memory read it will go into the read state and read from the memory 130. If the MSIM 110 gets a new read request, it will stay in this mode and it will do more memory reads. When there are no more memory reads, the FSM 11 returns to an idle state. If the FSM 11 is reading data, but receives a write data request, then from idle mode or read data mode the FSM 11 goes then into the mini check (WRWR process), which is the top line of FIG. 13. Here, the write will invert data and then read the inverted data. The original data is written, and the mini check is done. The memory location is safe to be used or provides one or more signals indicating that there are errors. If the mini check is completed a new memory check mini check may be entered for a different memory location or there is no action anymore and the FSM 11 returns to the idle state.

During the mini check, the FSM 11 is in a state CC or EE or GG or II. Here, the controller may seek to do a read, but because it does not want to block the performance of the controller it may stop the mini check. In that case, the FSM 11 may go from the mini check state into a read data state and stay in that read data state or go back into the mini check state. In this case, if there is a write data into the memory 130, the mini check the controller may want to access a different address and read from that address so that the mini check is in a hold state. It first will service that new read and then it will go back to the mini check and will continue with the mini check. This is illustrated as going from CC to DD to EE in FIG. 13. In every state of the mini checks, if there is a memory in a read state, it has higher priority and then it goes into the read data state as illustrated in the diagram.

Turning now to FIG. 14, illustrated is the controller as it emerges from a reset. Here, the MSIM 110 also may conduct a mini check. If the mini check is done, the MSIM 110 goes into the idle state and provides the controller the possibility to do reads and writes. This may be done during boot operations, e.g., a check for the control signals. The read and write and the select signals are used to verify the memory 130 as a pre-check and put it into a functional (mission)

mode for use. It could also be that the mini check indicates that the memory 130 is broken and may be unusable. The reason for the mini check here is because there is no valid controller access started yet. The controllers may be still on reset and in that reset mode, this kind of mini check verifies the memory 130 for a pre-defined location.

Figure 15:
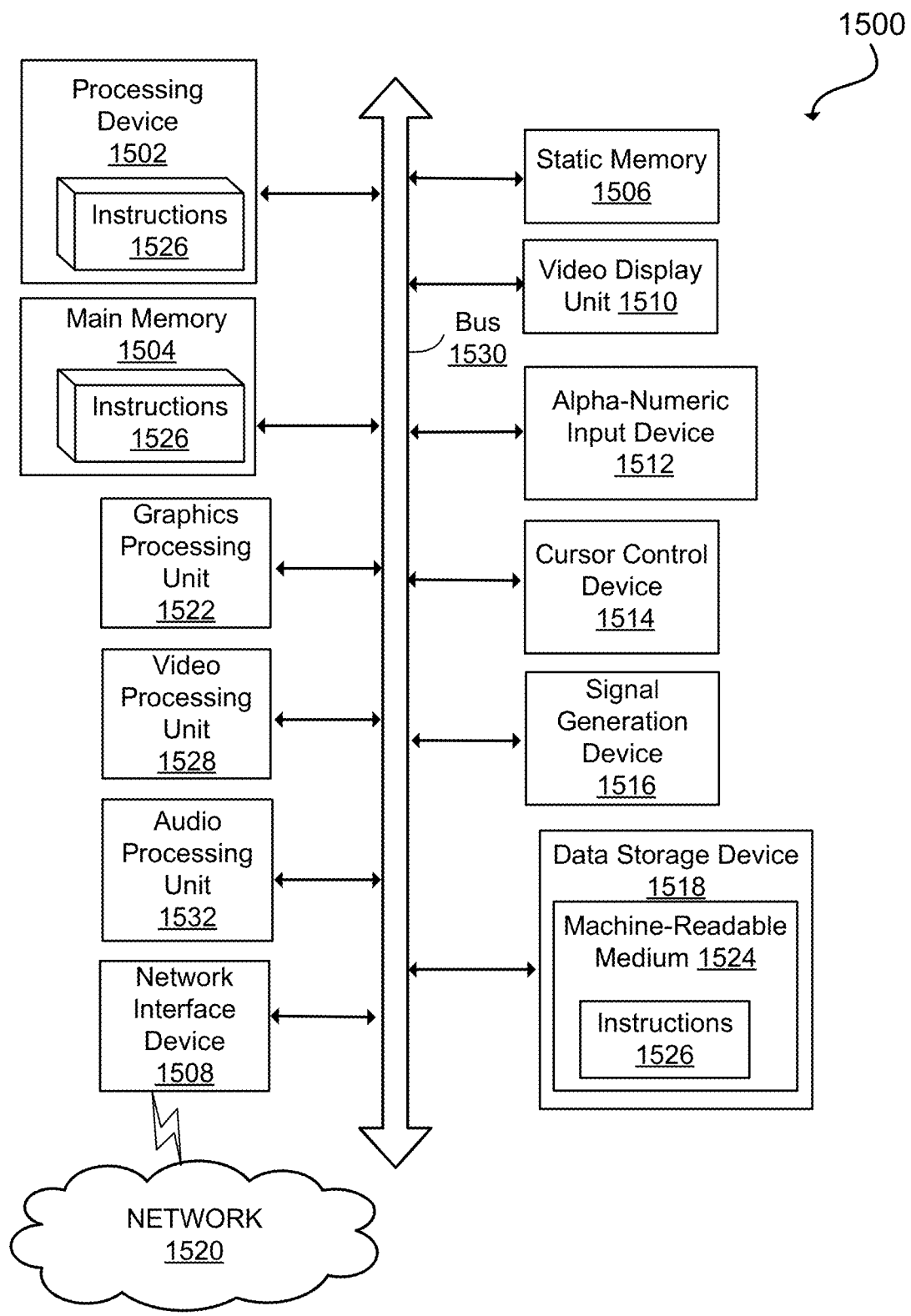
FIG. 15 depicts a diagram of an example computer system in which embodiments of the present disclosure may operate.

FIG. 15 illustrates an example machine of a computer system 1500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1502 may be configured to execute instructions 1526 for performing the operations and steps described herein.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1516 (e.g., a speaker), graphics processing unit 1522, video processing unit 1528, and audio processing unit 1532.

The data storage device 1518 may include a machine-readable storage medium 1524 (also known as a non-transitory computer-readable medium) on which is stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method to test a memory address of a memory and a data within the memory address, the method comprising:
    receiving an original data from a digital logic;
    inverting bits of the original data to generate an inverted data;
    writing the inverted data to the memory address;
    reading the inverted data from the memory address;
    determining whether the memory address and the inverted data are correct by checking the memory address the inverted data was written to using an error correction value based on a concatenation of the inverted data and the memory address; and
    performing one of:
        writing the original data to the memory address in response to the memory address and the inverted data being correct; and
        transmitting an error indication in response to at least one or more of the memory address and the inverted data being incorrect.

2. The method of claim 1, further comprising storing the original data in a buffer prior to writing to the memory.

3. The method of claim 1, wherein the writing of the inverted data further comprises:
    generating an error identifier value; and
    writing the error identifier value corresponding to the inverted data to the memory address.

4. The method of claim 3, wherein the determining whether the memory address and the inverted data are correct further comprises checking the error identifier value corresponding to the received inverted data and memory address.

5. The method of claim 1, wherein the error correction value is an error correction code (ECC) value and further comprising:
    generating ECC value by concatenating the inverted data and the memory address; and
    writing with ECC value corresponding with the original data to the memory address.

6. The method of claim 5, further comprising:
    reading the original data and the ECC value from the memory address; and
    checking the original data read from the memory location is correct using the corresponding ECC value.

7. The method of claim 1, further comprising:
    receiving a request from the digital logic to write a second original data to the memory; and
    transmitting to the digital logic a stall signal in response to the data being written to the memory.

8. The method of claim 1, further comprising:
    reading the original data from the memory address; determining whether the memory address and the original data are correct; and in case incorrect, transmit an error indication.

9. The method of claim 1, further comprising disabling a clock signal to the memory when a finite state machine is idle.

10. A non-transitory computer readable storage medium comprising stored instructions to test a memory address of a memory and a data within the memory address, the instructions executable by one or more processors, the instructions when executed causes the one or more processors to:
    receive an original data from a digital logic:
    invert the bits of the original data to generate an inverted data;
    write the inverted data to the memory address:
    read the inverted data from the memory address:
    determine whether the memory address and the inverted data are correct through a check of the memory address the inverted data was written to using an error correction value based on a concatenation of the inverted data and the memory address; and
    perform one of:
        write the original data to the memory address in response to the memory address and the inverted data being correct: and
        transmit an error indication in response to at least one of the memory address and the inverted data being incorrect.

11. The non-transitory computer readable storage medium of claim 10, wherein the original data is stored in a buffer prior to writing to the memory.

12. The non-transitory computer readable storage medium of claim 10, wherein the instruction to write the inverted data further comprises instructions that when executed causes the one or more processors to:
    generate an error identifier value: and
    write the error identifier value corresponding to the inverted data to the memory address.

13. The non-transitory computer readable storage medium of claim 12, wherein the instructions to determine whether the memory address and the inverted data are correct further comprises instructions that when executed causes the one or more processors to check the error identifier value corresponding to the received inverted address.

14. The non-transitory computer readable storage medium of claim 10, wherein the error correction value is an error correction code (ECC) value and further comprising instructions that when executed causes the one or more processors to:
    generate ECC value by concatenating the inverted data and the memory address; and
    write with ECC value corresponding with the original data to the memory address.

15. The non-transitory computer readable storage medium of claim 14, further comprising instructions that when executed causes the one or more processors to:
  read the original data and the ECC value from the memory address; and
  check the original data read from the memory location is correct based on the corresponding ECC value.

16. The non-transitory computer readable storage medium of claim 10, further comprising instructions that when executed causes the one or more processors to:
  receive a request from the digital logic to write a second original data to the memory; and
  transmit to the digital logic a stall signal if the original data being is being written to the memory.

17. The non-transitory computer readable storage medium of claim 10, further comprising instructions that when executed causes the one or more processors to:
  reading the original data from the memory address; determining whether the memory address and the original data are correct; and in case incorrect, transmit an error indication.

18. The non-transitory computer readable storage medium of claim 10, further comprising instructions that when executed causes the one or more processors to disable a clock signal to the memory when a finite state machine is idle.

19. A non-transitory computer readable storage medium comprising stored instructions, the instructions executable by at least one processor, the instructions when executed causes the processor to:
  transmit to a memory to initiate a write a first memory enable signal, a first write signal, a memory address, and an original data;
  store the memory address in an address write buffer and the data in a data write buffer;
  invert each bit of the original data to form an inverted data;
  store in a delay buffer the inverted data and the memory address;
  concatenate the inverted data and the memory address in an error detection generator to generate a first error identifier;
  transmit to the memory the inverted data and the first error identifier;
  transmit to the memory a second memory enable signal and a first read signal;
  read from the memory address the inverted data and the first error identifier to confirm the data, the first error identifier, and the memory address are correct by comparing the data in the delay buffer with the read inverted data; and
  store the original data and the memory address into the delay buffer.

20. The non-transitory computer readable storage medium of claim 19, further comprising stored instructions that when executed causes the processor to:
  concatenate the original data and the memory address in an error detection generator to generate a second error correction code;
  transmitting to the memory a third memory enable signal, a second write signal;
  transmit to the memory address the original data and the second error identifier;
  transmit to the memory a fourth memory enable signal and a second read signal;
  read from the memory address the original data and the second error identifier to confirm the data, the second error identifier and the memory address are correct by comparing the data in the delay buffer with the read original data; and
  compare the read original data and the second error identifier against the memory address that was stored in the delay buffer to confirm the data, the second error identifier and the memory address are correct.

\* \* \* \* \*